US010326038B2

(12) United States Patent
Conway et al.

(10) Patent No.: US 10,326,038 B2
(45) Date of Patent: Jun. 18, 2019

(54) THREE-DIMENSIONAL CO-AXIAL LINEAR PHOTONIC SWITCH

(71) Applicant: Lawrence Livermore National Security, LLC, Livermore, CA (US)

(72) Inventors: Adam Conway, Livermore, CA (US); Mihail Bora, Livermore, CA (US); Paulius Vytautas Grivickas, Livermore, CA (US); Lars Voss, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/802,210

(22) Filed: Nov. 2, 2017

(65) Prior Publication Data

US 2019/0131482 A1 May 2, 2019

(51) Int. Cl.
 *H03K 17/78* (2006.01)
 *H01L 31/16* (2006.01)
 *H01L 31/0224* (2006.01)

(52) U.S. Cl.
 CPC ........ *H01L 31/161* (2013.01); *H01L 31/0224* (2013.01); *H03K 17/78* (2013.01)

(58) Field of Classification Search
 CPC ............... H01L 31/161; H01L 31/0224; H01L 31/0312; H01L 31/08; H01L 51/42; H01L 51/5262; H01L 51/5253; H01L 51/0038; H01L 51/005; H01L 51/0081; H03K 17/78
 See application file for complete search history.

(56) References Cited

U.S. PATENT DOCUMENTS

| | | | | |
|---|---|---|---|---|
| 3,518,659 A * | 6/1970 | Chynoweth | ............ | H03K 17/74 327/514 |
| 4,056,404 A * | 11/1977 | Garone | ........... | H01L 31/035281 136/246 |
| 5,130,528 A * | 7/1992 | Phillips, Jr. | ............... | G02F 3/00 250/214 LS |
| 5,341,017 A * | 8/1994 | Booth | ............... | H01L 31/03529 257/459 |

(Continued)

OTHER PUBLICATIONS

Riel et al. Reverse biased photoconductive detectors and switches with separate absorption and detection area. Appl. Phys. Lett. 66, 1367 (1995), pp. 1366-1369.*

(Continued)

*Primary Examiner* — Galina G Yushina
(74) *Attorney, Agent, or Firm* — Perkins Coie LLP

(57) ABSTRACT

Techniques, systems, and devices are disclosed that relate to coaxial photoconductive switch modules. The coaxial photoconductive switch may include an outer conductor, an inner conductor, and a photoconductive material positioned between the inner conductor and the outer conductor. The inner conductor, the outer conductor, and the photoconductive material have a predetermined height. A bias voltage may be applied between the inner conductor and the outer conductor. When light of a predetermined wavelength and a predetermined intensity is incident on the photoconductive material, the photoconductive material may break down allowing a current to flow through the photoconductive material between the inner conductor and the outer conductor.

15 Claims, 6 Drawing Sheets

(56) References Cited

U.S. PATENT DOCUMENTS

| | | | | |
|---|---|---|---|---|
| 5,804,815 | A * | 9/1998 | Loubriel | H01L 31/08 250/214 LS |
| 9,595,423 | B2 * | 3/2017 | Leray | H01J 37/32082 |
| 2007/0092812 | A1 * | 4/2007 | Caporaso | H01L 31/09 430/57.7 |
| 2008/0178924 | A1 * | 7/2008 | Kempa | B82Y 10/00 136/244 |
| 2012/0313196 | A1 * | 12/2012 | Li | H01L 27/1446 257/429 |
| 2013/0336611 | A1 * | 12/2013 | Lee | G02F 1/025 385/2 |
| 2014/0312741 | A1 * | 10/2014 | Werne | H01L 41/107 310/339 |
| 2014/0363123 | A1 * | 12/2014 | Caporaso | G02B 1/005 385/16 |
| 2015/0187970 | A1 * | 7/2015 | Curry | H01L 31/03044 250/552 |
| 2016/0351735 | A1 * | 12/2016 | Lu | G09G 3/3233 |
| 2017/0264291 | A1 * | 9/2017 | Nelson | H03K 17/78 |

OTHER PUBLICATIONS

Sze, Semiconductor Devices; Physics and Technology, 2nd Edition, 2001, pp. 320-321; Hjalmarson et al. Continuum Models for Electrical Breakdown in Photoconductive Semiconductor Switches, Sandia Corporation, 2007, pp. 446-450.*

UDO Sensors Inc. Photodiode Characteristics and Applications.*

Jurling. Impedance Analysis and Breakdown Voltage in Dielectric Materials, pp. 5-45; Addison-Wesley, Chapter 24, Capacitors and Dielectrics; 27 slides.*

Sullivan, Wide Bandgap Extrinsic Photoconductive Switches, Jul. 3, 2013, Lawrence Livermore National Laboratory, LLNL-TH-640323 (Year: 2013).*

* cited by examiner

US 10,326,038 B2

THREE-DIMENSIONAL CO-AXIAL LINEAR PHOTONIC SWITCH

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to systems, devices, and processes to fabricate and use photoconductive switches.

BACKGROUND

A photoconductive switch is an electrical switch that is controlled by an optical input (e.g., light) to cause photo-induced conductivity of the switch material. For example, light applied to the switch material can increase its electrical conductance as a consequence of irradiation with light. Photoconductive switches can be used for photoconductive sampling, generation of high frequency pulses (e.g., terahertz pulses), high-speed photodetectors in optical fiber communications, and in analog-to-digital converters, among other applications. More flexible photoconductive switch modules that allow independent optimization of switch parameters are needed to provide efficient and cost-effective modules.

SUMMARY

The disclosed techniques, systems, and devices relate to coaxial photoconductive switch modules. In an example embodiment, a coaxial photoconductive device is disclosed. The photoconductive device includes a cylindrical outer conductor having an inner radius, a cylindrical inner conductor having an outer radius, and a photoconductive material. The photoconductive material is positioned between the outer radius of the inner conductor and the inner radius of the outer conductor. The inner conductor and the outer conductor are configured to establish an electric field across the photoconductive material upon application of a voltage between the inner and the outer conductors. The coaxial photoconductive device includes a light source having a particular wavelength or range of wavelengths coupled to the photoconductive material to inject light into the photoconductive material. The photoconductive material is shaped to have a height to allow propagation of the light from the light source through a substantial entirety of the height of the photoconductive material, thereby causing the photoconductive material to reduce in resistance and causing a current to flow through the photoconductive material between the inner conductor and the outer conductor.

Also disclosed is a method for forming a photoconductive switch module. The method includes forming a coaxial structure that includes a cylindrically symmetric outer conductor, a cylindrically symmetric inner conductor, and a photoconductive material filling a volume between the cylindrically symmetric inner conductor and the cylindrically symmetric outer conductor. The cylindrically symmetric inner conductor, the cylindrically symmetric outer conductor, and the photoconductive material are configured as a photoconductive switch between the cylindrically symmetric inner conductor, the cylindrically symmetric outer conductor. The method further includes selecting a height value for the coaxial structure. In some example embodiments, the inner conductor and outer conductor may have a shape different from cylindrical. For example, the inner and/or outer conductor may be triangular, square, hexagonal, or another shape.

Also disclosed is a photoconductive switch. The photoconductive switch includes an outer electrode, an inner electrode, and a photoconductive material positioned between inner electrode and the outer electrode. The inner electrode and the outer electrode are configured to allow an electric field to be established across the photoconductive material upon application of a voltage between the inner and the outer electrodes. The photoconductive material is shaped to have a predetermined height to allow, upon injection of light having a particular wavelength or range of wavelengths into the photoconductive material, the light to propagate through a substantial entirety of the height of the photoconductive material, thereby causing the photoconductive material to break down and a current to flow through the photoconductive material between the inner electrode and the outer electrode.

The following features may be included in any combination. The photoconductive material breaks down at a breakdown voltage applied between the inner conductor and outer conductor, wherein the breakdown voltage is determined by the photoconductive material, the bias voltage, and a thickness of the photoconductive material. The inner conductor and the outer conductor are formed from a material that includes one or more of the following metals: titanium, gold, aluminum, silver, platinum, chromium, or copper, or one or more conductive ceramics including indium tin oxide (ITO), aluminum doped zinc oxide (AZO), or fluorine doped tin oxide (FTO). The inner cylinder may be formed into a solid or hollow cylinder of the material. The photoconductive material includes but is not limited to one or more of: silicon, germanium, silicon carbide, diamond, gallium nitride, gallium arsenide, gallium phosphide, aluminum nitride, boron nitride, zinc oxide, gallium oxide, or cadmium telluride. The height of the photoconductive material may be determined based on an absorption of the incident light through the photoconductive material. For example, the height may be chosen so that 90%, or another percentage, of the incident light is absorbed as the incident light passes through the photoconductive material. The outer conductor, the inner conductor, and the photoconductive material are each shaped to have the same predetermined height. The photoconductive device is configured to allow light from the light source travel through the photoconductive material along a longitudinal axis of the photoconductive material. The light source is configured to illuminate the photoconductive material from a first end of the photoconductive material so that the light from the light source propagates substantially parallel to a longitudinal axis of the photoconductive material. The forming the coaxial structure is performed using laser cutting or etching. The cylindrically symmetric outer conductor and the cylindrically symmetric inner conductor are formed using one or more of e-beam deposition, sputtering, chemical vapor deposition, electrodeposition, or other method. The cylindrically symmetric inner conductor and the cylindrically symmetric outer conductor are formed from a conductive material such as: titanium, gold, aluminum, silver, platinum, chromium, or copper, or one or more conductive ceramics including ITO, AZO, or FTO. The photoconductive material includes a semiconductor such as silicon, germanium, silicon carbide, diamond, gallium nitride, gallium arsenide, gallium phosphide, aluminum nitride, boron nitride, zinc oxide, gallium oxide, or cadmium telluride. A height of the coaxial structure is determined based on an absorption of the incident light as is passes through the photoconductive material. For example, the height may be chosen so that 90%, or another percentage, of the incident light is absorbed as the incident light passes through the photoconductive material. The cylindrically symmetric inner conductor and the photoconductive material are shaped to have a same predetermined height. The photoconductive switch module is configured to allow light from a source to travel through the photoconductive material along a longitudinal axis of the photoconductive material. A light source is configured to illuminate the photoconductive material from a first end of the photoconductive material so that the light from the light source propagates substantially parallel to a longitudinal axis of the photoconductive material. The height value for the coaxial structure is selected to produce a predetermined absorption efficiency in the photoconductive material. A thickness of the photoconductive material is equal to the difference between the outer radius of the inner conductor and the inner radius of the outer conductor, wherein the thickness is selected to produce a predetermined breakdown voltage. The height is selected to cause, at a predetermined minimum light intensity at the particular wavelength or the range of wavelengths, the photoconductive material to break down. The outer electrode and the inner electrode may have a circular cross-sectional shape, a square cross-sectional shape, or any polygonal cross-sectional shape.

DETAILED DESCRIPTION

Figure 1:
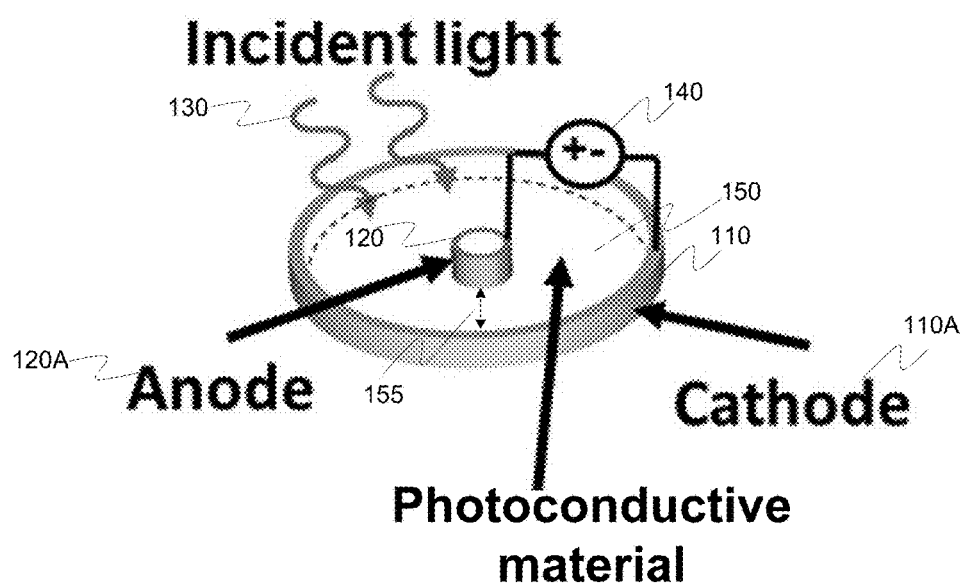
FIG. 1 depicts an example of a photoconductive switch, in accordance with example embodiments.

High voltage and high current switches have broad applicability in science and industry. The ability to switch high voltages and high currents can be an enabling technology for pulsed systems such as radar systems, communication systems, arbitrary-waveform generated high power RF sources, amplifier systems, and many other applications. Disclosed herein are devices capable of switching high voltages and high currents and methods of fabricating those devices.

In some example embodiments, a photoconductive switch includes two concentric cylinders that are conductive; an inner cylinder and an outer cylinder. A photoconductive material fills a gap formed between the inner cylinder and the outer cylinder. As used herein, a cylinder includes a tube and a hollow cylinder. The cylinder has a cross-section that is circular or oblong. In some example embodiments, the interior of the inner cylinder is metal and in other example embodiments, the inner cylinder is hollow. A bias voltage can be applied between the inner and outer cylinders. Light is incident on the photoconductive material. When a sufficient amount of light per unit length is absorbed in the photoconductive material, the photoconductive material becomes conducting thereby causing an electrical connection between the inner cylinder and the outer cylinder. The photoconductive material may become conductive in a linear mode or an avalanche mode which is sometimes referred to as breakdown. The absorption of the incident light in the photoconductive material is determined at least in part by the physical properties of the photoconductive material and the wavelength of the incident light. Several factors influence the degree to which the photoconductive material becomes conductive. The factors include the physical properties of the photoconductive material, the length of photoconductive material, the bias voltage, the geometry of the electrical contacts, and the wavelength of the incident light. The bias voltage may affect the amount of light per unit length that must be absorbed to cause conduction of the photoconductive material. In another aspect, a breakdown voltage is a voltage between the inner and outer conductors that when exceeded, the photoconductive material breaks down and conducts between the inner and outer cylinders. The breakdown voltage is influenced by the physical properties of photoconductive material, the thickness of the photoconductive material between the inner and outer cylinders, the curvature of the inner cylinder, and the wavelength (or range of wavelengths) of the light on the photoconductive material. A smaller radius of curvature may have a lower breakdown voltage than a larger radius of curvature because the electric field density is higher for a smaller radius of curvature. A smaller thickness of the photoconductive material may have a lower breakdown voltage because the field strength is inversely proportional to the thickness. A higher light intensity incident on the photoconductive material may cause a lower breakdown voltage.

In some example embodiments, an absorption efficiency of the photoconductive material and a breakdown voltage can be chosen separately. The absorption efficiency of the photoconductive switch can be tailored or selected by tailoring or selecting the length of the photoconductive material. The longer the length of the photoconductive material, the more of the incident light is absorbed (assuming the incident light source has suitable spectral content and intensity). Also, the longer the length of the photoconductive material, the higher the current carrying capability between the inner and outer cylinders. Moreover, the breakdown voltage of the photoconductive material can be adjusted or selected based on the radii of the inner and outer cylinders and the difference in radii between the outer and inner cylinders. For a fixed bias voltage, the smaller the radii of the inner cylinder, the higher the electric field, and, thus, the photoconductive material is closer to breakdown. Also, the thinner the photoconductive material (the difference between the outer cylinder and inner cylinder radii), the higher the field in the photoconductive material, and, thus, the photoconductive material is closer to breakdown. In this way, the absorption efficiency and the breakdown voltage of the photoconductive switch may be chosen separately. In some previous photoconductive switches, the absorption efficiency and breakdown voltage could not be chosen separately.

In some example embodiments, the photoconductive switch is referred to as being "axially pumped" because the coaxial photoconductive switch is illuminated along a longitudinal axis of the switch (corresponding to the height of the cylinders). In previous switches, inefficient conversion of photons to electrons occurred due to the low absorption coefficient and short optical path length. Accordingly, a very high laser fluence was needed, which caused degradation of the metal contacts of the switch. Fiber optics delivering the light to the switch could also be damaged. To fully absorb 90% of a 1 micron wavelength light, approximately 10 cm of material may be needed. However, to standoff 50 kilovolts, only 200 microns of material may be needed (although thicker material may be used due to field enhancements at the contacts) which absorbs less than 1% of the incident light. By utilizing above bandgap light (<375 nm) the absorption in 4H SiC may be 200 cm$^{-1}$ which may correspond to a 50 um depth. In this patent document, a three-dimensional coaxial geometry separates conflicting length scales by applying the field in a direction orthogonal to the direction in which the light is absorbed. Additionally, the coaxial geometry confines the electric field within the rounded edges of the device which can reduce the field enhancements at the contacts thereby raising the breakdown voltage of the device to closer to the material breakdown strength. Operating at the breakdown strength of the material allows the spacing between the electrodes to be reduced, which in turn can reduce the laser energy needed by the reduction in electrode thickness spacing squared.

FIG. 1 depicts a photoconductive switch system that can be used to facilitate the understanding of the description that follows. The photoconductive switch includes an outer cylinder 110, an inner cylinder 120, and a photoconductive material 150. A direct current (DC) bias voltage 140 may be applied between the inner cylinder and outer cylinder. Incident light 130 impinges at one end of photoconductive material 120. In some example embodiments, the photoconductive material may be illuminated from both ends. In some example embodiments, the photoconductive material may be illuminated from one end and a mirror may be placed at the other end of the photoconductive material causing light reaching the mirror to be reflected back into the photoconductive material thereby improving the absorption in the photoconductive material of the incident light.

Inner cylinder 120 and outer cylinder 110 may be each have thicknesses. For example, outer cylinder 110 may have an inner radius and an outer radius. The difference between the outer radius of outer cylinder 110 and the inner radius of the outer cylinder 110 is the thickness of outer cylinder 110. In a similar fashion, the difference between the outer radius of inner cylinder 120 and the inner radius of the inner cylinder 120 is the thickness of inner cylinder 120. The thicknesses of the outer cylinder and the inner cylinder may be the same or may be different. The material of the outer cylinder and the inner cylinder may be the same or may be different. The inner and outer cylinders may include one or more materials including titanium, gold, aluminum, platinum, chromium, copper, or other metal or any combination of metals. The material(s) may also include conductive ceramics such as indium tin oxide (ITO), aluminum doped zinc oxide (AZO), fluorine doped tine oxide (FTO), or other conductive material, or combination of materials.

Photoconductive material 150 may be placed between outer cylinder and inner cylinder 120. Photoconductive material 150 may have a thickness up to the difference between the inner radius of the outer cylinder 110 and the outer radius of the inner cylinder 120. Photoconductive material 150 may be a semiconductor material. Photoconductive and semiconductor materials may include one or more of group IV materials such as silicon, germanium, silicon carbide, diamond; group III-V materials such as gallium nitride, gallium arsenide, gallium phosphide, aluminum nitride, boron nitride; II-VI materials such as zinc oxide, cadmium telluride; or any combination of the foregoing materials.

A bias voltage may be applied between outer cylinder 110 and inner cylinder 120. For example, a voltage source 140 may be connected between the outer cylinder 110 and the inner cylinder 120. The positive side of the voltage source 140, the anode 120A, may be connected to the inner cylinder 120, and the negative side of voltage source 140, the cathode 110A, may be connected to the outer cylinder 110. The bias voltage may be connected with the anode connected to outer cylinder 110 and the cathode connected to inner cylinder 120 (not shown in FIG. 1).

Incident light 130 may illuminate photoconductive material 150. Incident light 150 may be absorbed by photoconductive material 150. The amount of absorption per unit length of photoconductive material 150 depends on the physical properties of photoconductive material 150 and the wavelength(s) of the incident light. The absorption rate may be independent of bias voltage. The percentage of light absorbed per unit length may be constant with intensity. For a given photoconductive material, various combinations of bias voltage 140 and intensity of incident light 130 may cause conduction across photoconductive material 150.

Figure 2:
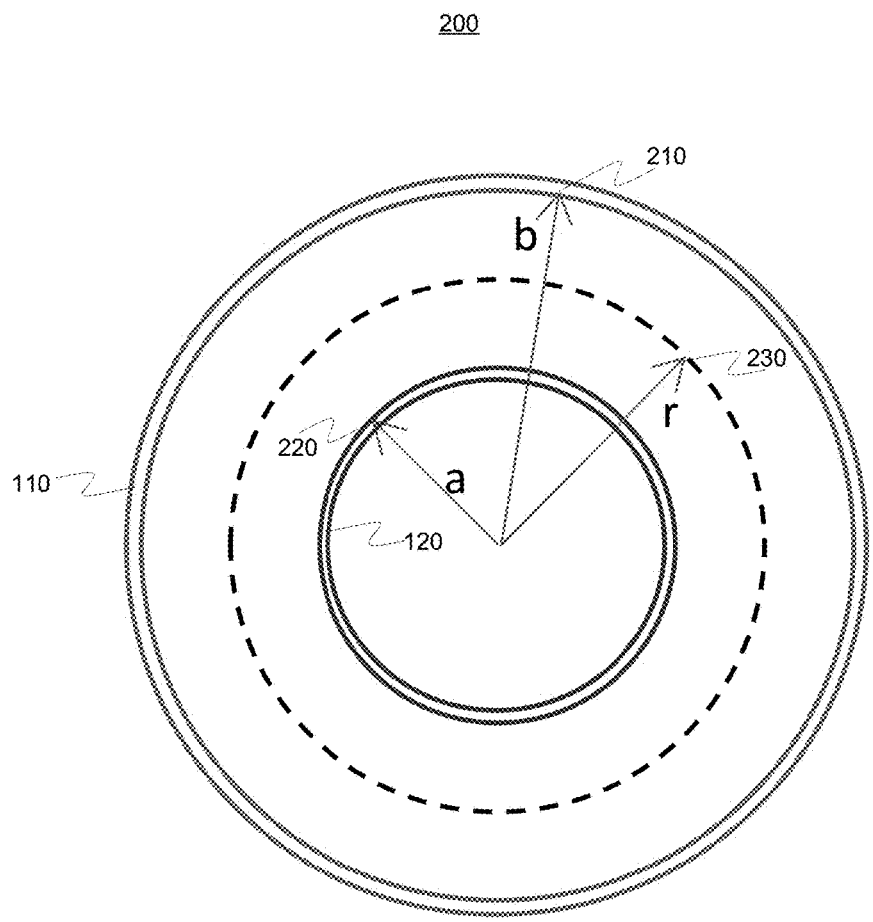
FIG. 2 depicts a cross-sectional view of an example of a photoconductive switch, in accordance with example embodiments.

FIG. 2 depicts a cross-sectional view of an example of a coaxial photoconductive switch, in accordance with some example embodiments. The description of FIG. 2 also refers to FIG. 1. FIG. 2 includes an outer cylinder 110 and an inner cylinder 120 with photoconductive material 150 between the outer and inner cylinders. The inner cylinder has an outer radius, a, at 220, and the outer cylinder has an inner radius, b, at 210. The photoconductive switch 200 is shaped such that inner cylinder 120, outer cylinder 110, and photoconductive material 150 have a height h (not shown in FIG. 2) perpendicular to the page of FIG. 2. Photoconductive material 150 fills the volume bound by the outer radius, a, of inner cylinder 120, inner radius, b, of outer cylinder 110, and height h.

In operation, a voltage is applied between the inner cylinder 120 and outer cylinder 110 as described in FIG. 1. In this way, inner cylinder 120, outer cylinder 110, and photoconductive material 150 may form a capacitor. The charge, Q of the capacitor is then related to the applied voltage with a relationship that may be expressed as Equation 1.

$$V = \int E dr = \frac{Q}{2\pi\varepsilon_0 h}\ln\left(\frac{b}{a}\right) \quad \text{Eq. (1)}$$

where, E is the electric field, h is the height of the electrode, and ln is the natural logarithm. The integral in Equation 1 is calculated over a radius, r, at 230 from a at 220 to b at 210. The electric field, E, may be expressed as Equation 2.

$$E = \frac{Q}{2\pi\varepsilon_0 r h} = \frac{V}{\ln\left(\frac{b}{a}\right)r} \quad \text{Eq. (2)}$$

A smaller distance (b−a) between electrodes provides more current for a given light intensity. A smaller distance (b−a) between electrodes may support a lower switch conduction voltage. The conduction voltage is also dependent on the ratio of b/a. A larger ratio of b/a has a larger difference in curvature between the inner and outer cylinders which creates a larger field enhancement at the inner cylinder. For example, a switch with outer radius, b, of 1 cm and inner radius, a, of 0.5 cm and with bias voltage 140 equal to 10,000 Volts experiences a maximum field of 28,853.9 Volts per centimeter.

In some example embodiments, the fraction of incident light that passed through the photoconductive material may be expressed as, $$\frac{I}{I_0} = e^{-ah} \qquad \text{Eq. (3)}$$

where I is the intensity at a distance h through the photoconductive material from the incident light with initial intensity $I_0$, and a is the absorption coefficient of the photoconductive material. In some example embodiments, h may be chosen so that $I/I_0$=0.10, or equivalently 90% of the incident intensity his absorbed in the photoconductive material in path length h.

Figure 3:
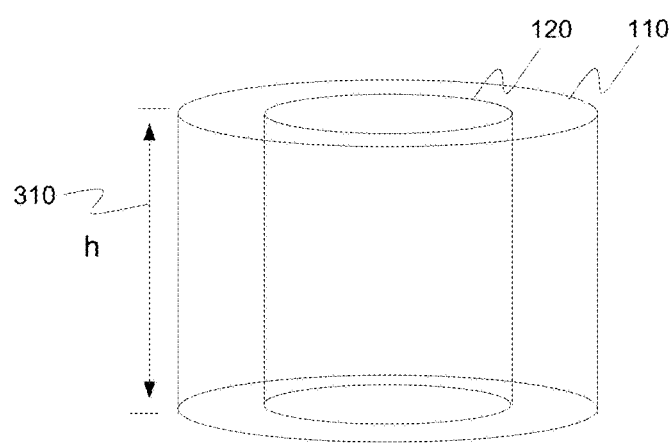
FIG. 3 depicts a side view of an example of a photoconductive switch, in accordance with example embodiments.

FIG. 3 depicts a side view of a photoconductive switch, in accordance with some example embodiments. FIG. 3 depicts an outer cylinder 110, an inner cylinder 120, and photoconductive material 150 between the inner and outer cylinders. FIG. 3 depicts height, h, at 310. Cylinders 110, 120, and photoconductive material 150 are each shown in FIG. 2 to be of height, h, 310. The height of photoconductive material 150 may be the same or different from one or more of outer cylinder 110 and inner cylinder 120.

Figure 4B:
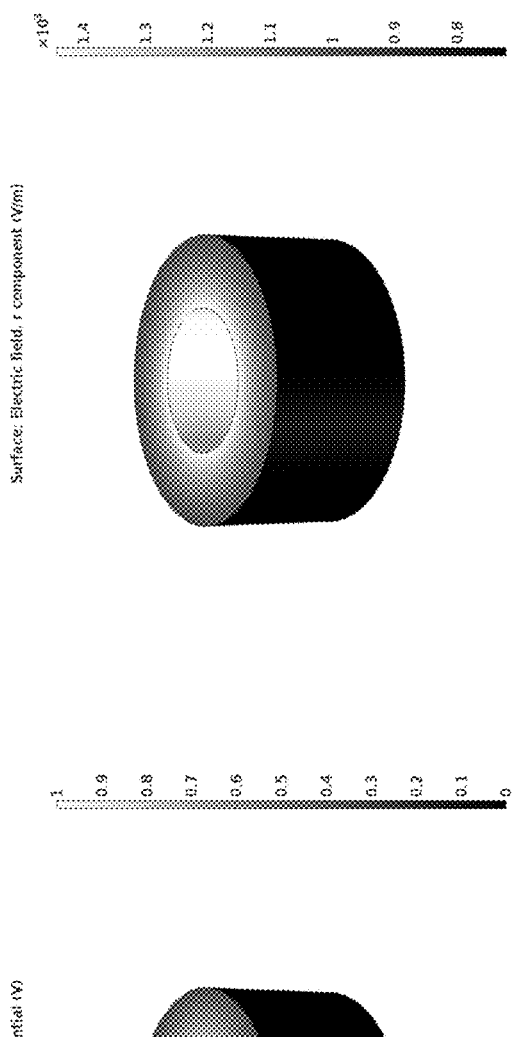
FIG. 4B depicts an example of a simulation showing the electric field strength, in accordance with example embodiments.
Figure 4A:
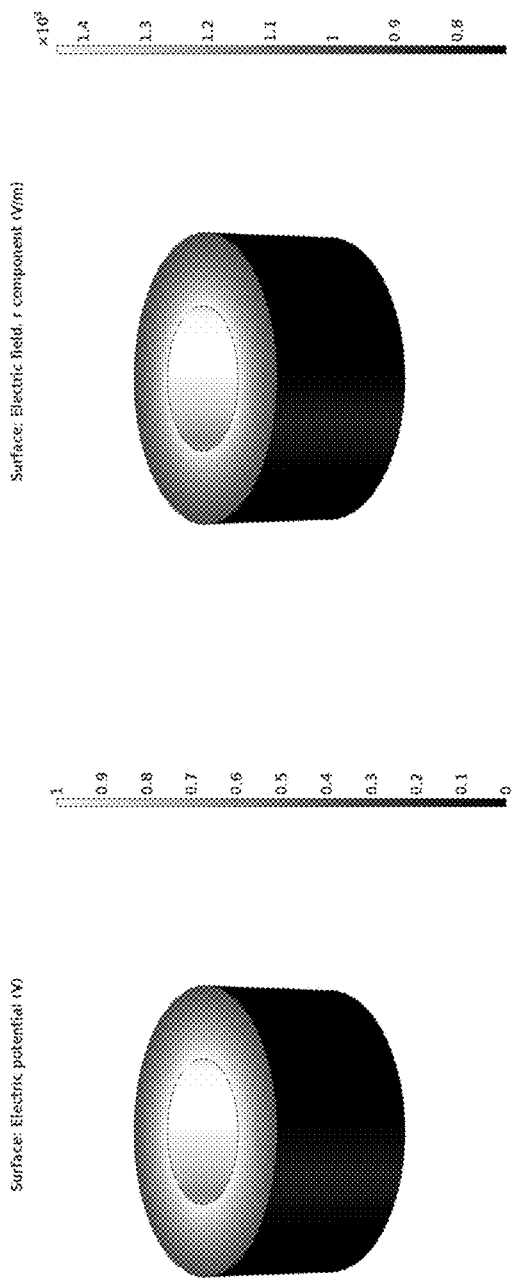
FIG. 4A depicts an example of a simulation showing the electric potential, in accordance with example embodiments.

FIG. 4A depicts a plot of electric potential and FIG. 4B depicts a plot of electric field strength for a coaxial example photoconductive switch, in accordance with some example embodiments. The description of FIGS. 4A-4B also refer to FIGS. 1-3. FIGS. 4A-4B depict outer cylinder 120, inner cylinder 110, and the electric field strength between the cylinders. A shaded scale is shown at 410 indicating the field strength. The highest field strengths are closest to the inner cylinder 110 and the lowest field strengths are closest to the outer cylinder 120. Moving from outer cylinder 120 to inner cylinder 110, the field strength increases. In some example embodiments, breakdown starts at a location where the highest field strengths are present. In some example embodiments, edge effects may occur that cause field enhancements thereby increasing the field strength at the edges. For example, edge effects may occur at the top and bottom of the inner and outer cylinders. Higher field strengths due to edge effects may cause conduction at bias voltages lower than the breakdown voltage or with less incident light intensity.

Some example embodiments may be fabricated using a laser cutting process. In one example fabrication process, the above-described photoconductive material is first in the shape of a block or rectangular prism. The block is then laser cut into a shape such as a cylinder. An inner section of the cylinder is removed via laser cutting to produce an annulus shape. The interior and exterior of the annulus is then polished and electrodes are deposited on the outer cylindrical surface and the inner cylindrical surface. The top and bottom surfaces of the annulus may not have electrodes deposited but may have other layers applied such as an anti-reflective coating. The electrodes may be deposited using e-beam deposition, sputtering, chemical vapor deposition (CVD), electrodeposition, or other method. Bond wires or another contact mechanism may be used to connect a bias supply to the inner and outer cylindrical surfaces.

Some example embodiments may be fabricated using etching. In one example, an etch mask is applied to a block of photoconductive material. The etch mask may be deposited or patterned onto the photoconductive material. The etch mask may be nickel or other mask material. Etching etches away the photoconductive material except the annulus. Dry etching or wet etching may be used. For example, inductively coupled plasma (ICP) etching, electron cyclotron resonance (ECR), or reactive-ion etching (RIE) may be used. The interior and exterior of the annulus is then polished and electrodes are deposited on the outer cylindrical surface and the inner cylindrical surface. The top and bottom surfaces of the annulus may not have electrodes deposited but may have other layers applied such as an anti-reflective coating. The electrodes may be deposited using e-beam deposition, sputtering, chemical vapor deposition (CVD), electrodeposition, or other method. Bond wires or another contact mechanism may be used to connect a bias supply to the inner and outer cylindrical surfaces.

Figure 5:
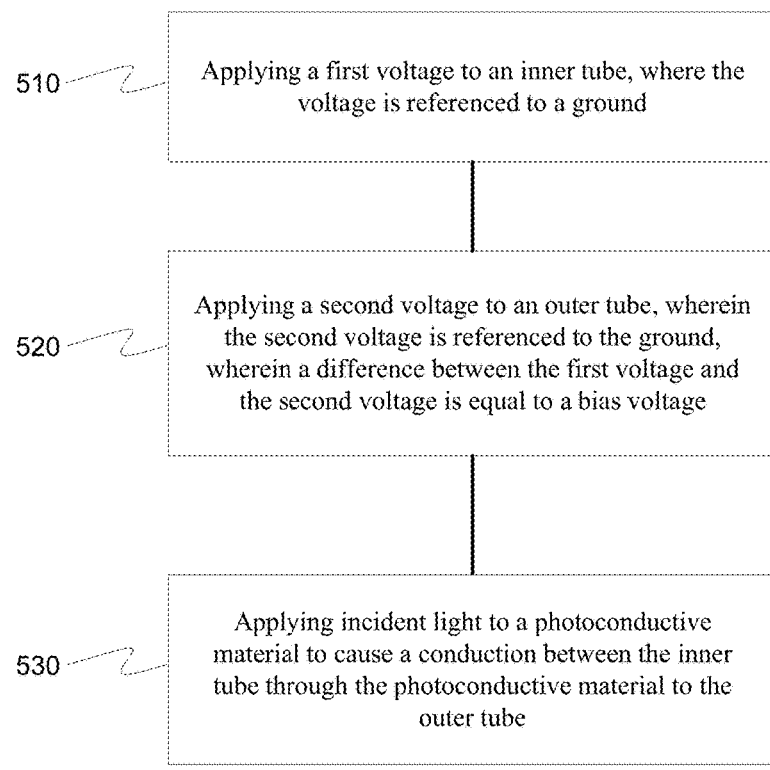
FIG. 5 depicts a process, in accordance with some example embodiments.

FIG. 5 depicts a process, in accordance with example embodiments. At 510, a first voltage referenced to a ground is be applied to an inner cylinder. At 520, a second voltage referenced to the ground is be applied to an outer cylinder. At 530, light illuminates a photoconductive material filling a volume between the inner and outer cylinders. The description of FIG. 5 also refers to FIGS. 1-4B.

At 510, a first voltage is applied to an inner cylinder. For example, inner cylinder 120 may be connected via a bond wire or other connection to a voltage source referenced to a ground. For example, inner cylinder 120 may be biased to a voltage of 5000 volts referenced to a ground.

At 520, a second voltage is be applied to an outer cylinder. For example, outer cylinder 110 may be connected via a bond wire or other connection to a voltage source referenced to the ground. For example, outer cylinder 110 may be biased to a voltage of 100 volts referenced to the ground. In this example, the bias voltage applied across the photoconductive material is 5000-100=4900 volts. Other voltages may be applied to the inner and outer conductors to produce other bias voltages. In some example embodiments, a negative bias voltage (outer cylinder biased to a higher voltage than the inner cylinder) is applied instead of a positive voltage such as the foregoing example.

At 530, incident light is applied to a photoconductive material 150 between the inner 120 and outer 110 cylinders. When the light has a predetermined wavelength or band of wavelengths, the photoconductive material 150 may conduct. Other wavelengths or bands of wavelengths may cause the photoconductive material to conduct at a higher or lower light intensity. The bias voltage may affect the intensity needed to cause conduct. In some example embodiments, a higher bias voltage corresponds to avalanche conduction at a lower (or higher) light intensity.

Figure 6:
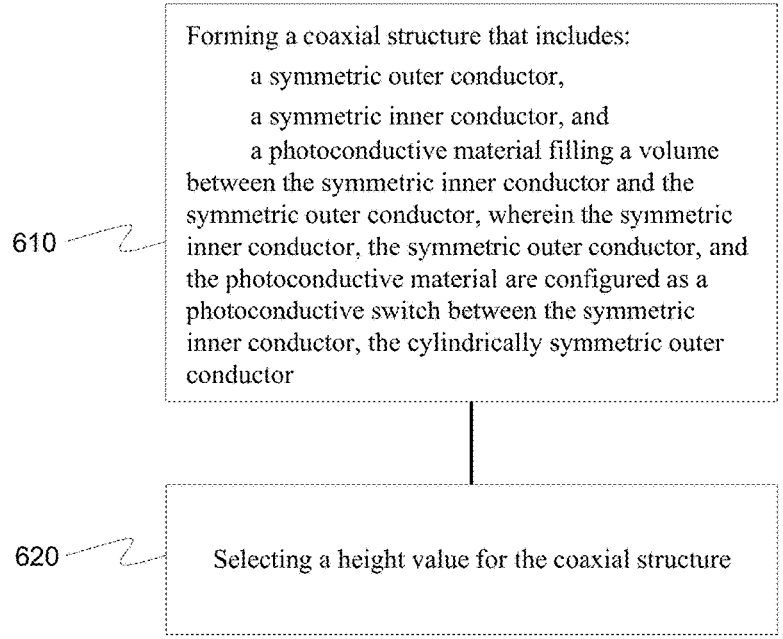
FIG. 6 depicts a process for forming a photoconductive switch module, in accordance with some example embodiments.

FIG. 6 depicts a process for forming a photoconductive switch module, in accordance with some example embodiments. FIG. 6 also refers to FIGS. 1-5. At 510, the method includes forming a coaxial structure. At 520, the method includes selecting a height for the coaxial structure.

At 510, a coaxial structure is formed including a cylindrically symmetric outer conductor, a cylindrically symmetric inner conductor, and a photoconductive material filling a volume between the cylindrically symmetric inner conductor and the cylindrically symmetric outer conductor. The cylindrically symmetric inner conductor, the cylindrically symmetric outer conductor, and the photoconductive material are configured as a photoconductive switch between the cylindrically symmetric inner conductor, the cylindrically symmetric outer conductor. In some example embodiments, the coaxial structure includes outer cylinder 110, inner cylinder 120, and a photoconductive material 150 as described above.

At 520, a height value for the coaxial structure is selected. In some example embodiments, the height is selected to produce an absorption efficiency in the photoconductive material. In some example embodiments, other factors that may affect the height value include a thickness that the photoconductor may be grown, or a depth of a hole in the center of the photoconductive material.

In this patent document, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A high-voltage coaxial photoconductive device for switching a voltage or a current, comprising:
    a cylindrical outer conductor having an inner radius;
    a cylindrical inner conductor having an outer radius;
    a photoconductive material positioned between the outer radius of the inner conductor and the inner radius of the outer conductor, wherein the inner conductor and the outer conductor are configured to establish an electric field across the photoconductive material upon application of a voltage value between the inner and the outer conductors; and
    a light source having a particular wavelength or range of wavelengths, the light source coupled to the photoconductive material to inject light into the photoconductive material, wherein the photoconductive material is shaped to have a height to allow the light to propagate from the light source through a substantial entirety of the height of the photoconductive material and to be absorbed by the photoconductive material with a corresponding absorption efficiency, thereby causing the photoconductive material to break down and to become conductive and a current to flow through the photoconductive material between the inner conductor and the outer conductor,
    wherein the photoconductive material is configured to break down at a breakdown voltage based on properties of the photoconductive material and a thickness of the photoconductive material, the thickness of the photoconductive material determined based on the inner radius of the outer conductor and the outer radius of the inner conductor.

2. The coaxial photoconductive device as in claim 1, wherein the inner conductor and the outer conductor are formed from a material that includes one or more of the following metals: titanium, gold, aluminum, silver, platinum, chromium, or copper, or one or more conductive ceramics including indium tin oxide (ITO), aluminum doped zinc oxide (AZO), or fluorine doped tine oxide (FTO).

3. The coaxial photoconductive device as in claim 2, wherein the inner cylinder is formed as a solid cylinder of the material.

4. The coaxial photoconductive device as in claim 1, wherein the photoconductive material includes one or more of: silicon, germanium, silicon carbide, diamond, gallium nitride, gallium arsenide, gallium phosphide, aluminum nitride, boron nitride, zinc oxide, or cadmium telluride.

5. The coaxial photoconductive device as in claim 1, wherein the height of the photoconductive material is determined based on one or more of: the wavelength or range of wavelengths of the light source, the inner radius of the outer conductor, the outer radius of the inner conductor, or the voltage value between the inner and the outer conductors.

6. The coaxial photoconductive device as in claim 1, wherein the height for the coaxial structure is selected to produce a predetermined absorption efficiency in the photoconductive material.

7. The coaxial photoconductive device as in claim 1, wherein the thickness of the photoconductive material is equal to the difference between the outer radius of the inner conductor and the inner radius of the outer conductor, and wherein the thickness is selected to produce a predetermined breakdown voltage.

8. The coaxial photoconductive device as in claim 1, wherein the height is selected to cause, at a predetermined minimum light intensity at the particular wavelength or the range of wavelengths, the photoconductive material to break down.

9. The coaxial photoconductive device as in claim 1, wherein the outer conductor, the inner conductor, and the photoconductive material are each shaped to have the same height.

10. The coaxial photoconductive device as in claim 1, configured to allow light from the light source travel through the photoconductive material along a longitudinal axis of the photoconductive material.

11. The coaxial photoconductive device as in claim 1, wherein the light source is configured to illuminate the photoconductive material from a first end of the photoconductive material so that the light from the light source propagates substantially parallel to a longitudinal axis of the photoconductive material.

12. A high-voltage photoconductive device for switching a voltage or a current, comprising:
    an outer electrode;
    an inner electrode; and a photoconductive material positioned between inner electrode and the outer electrode, wherein:
  the inner electrode and the outer electrode are configured to allow an electric field to be established across the photoconductive material upon application of a voltage between the inner and the outer electrodes, and
  the photoconductive material is shaped to have a height to allow, upon injection of light having a particular wavelength or range of wavelengths into the photoconductive material, the light to propagate through a substantial entirety of the height of the photoconductive material and to be absorbed by the photoconductive material with a corresponding absorption efficiency, thereby causing the photoconductive material to break down and a current to flow through the photoconductive material between the inner electrode and the outer electrode,
  wherein the photoconductive material is configured to break down at a breakdown voltage based on properties of the photoconductive material and a thickness of the photoconductive material, the thickness of the photoconductive material determined based on sizes of the inner electrode and the outer electrode.

13. The photoconductive device of claim 12, wherein the outer electrode and the inner electrode have a circular cross-sectional shape.

14. The photoconductive device of claim 12, wherein the outer electrode and the inner electrode have a square cross-sectional shape.

15. The photoconductive device of claim 12, wherein the outer electrode and the inner electrode have a polygonal cross-sectional shape.

* * * * *